United States Patent
Ellis-Monaghan et al.

(10) Patent No.: US 9,588,293 B2
(45) Date of Patent: Mar. 7, 2017

(54) MEMS BASED PHOTONIC DEVICES AND METHODS FOR FORMING

(71) Applicant: International Business Machines Corporation, Armonk, NY (US)

(72) Inventors: John J. Ellis-Monaghan, Grand Isle, VT (US); Brendan S. Harris, Burlington, VT (US); Vibhor Jain, Essex Junction, VT (US); Thomas Kessler, Milpitas, CA (US); Yves T. Ngu, Essex, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 14/749,806

(22) Filed: Jun. 25, 2015

(65) Prior Publication Data
US 2016/0377805 A1 Dec. 29, 2016

(51) Int. Cl.
*G02B 6/12* (2006.01)
*G02B 6/125* (2006.01)
*G02B 6/122* (2006.01)
*G02B 6/35* (2006.01)
*G02B 6/28* (2006.01)
*B81B 7/02* (2006.01)

(52) U.S. Cl.
CPC ............... *G02B 6/125* (2013.01); *B81B 7/02* (2013.01); *G02B 6/1225* (2013.01); *G02B 6/2808* (2013.01); *G02B 6/3502* (2013.01); *G02B 6/357* (2013.01); *G02B 6/3562* (2013.01); *B81B 2201/045* (2013.01); *G02B 2006/1215* (2013.01); *G02B 2006/12145* (2013.01)

(58) Field of Classification Search
CPC .... G02B 6/125; G02B 6/1225; G02B 6/2808; G02B 6/3502; G02B 6/3562; G02B 6/357; B81B 7/02
USPC ............................................................ 385/14
See application file for complete search history.

(56) References Cited

U.S. PATENT DOCUMENTS

| | | |
|---|---|---|
| 6,618,519 B2 | 9/2003 | Chang et al. |
| 6,658,176 B2 | 12/2003 | Amantea |
| 6,671,433 B2 | 12/2003 | Kashihara et al. |
| 6,694,071 B2 | 2/2004 | Hsu |
| 6,810,166 B2 | 10/2004 | Baumann et al. |
| 6,823,098 B2 | 11/2004 | Guidotti et al. |
| 6,836,591 B2 | 12/2004 | Kashihara et al. |
| 6,961,488 B2 | 11/2005 | Lee et al. |
| 7,003,188 B2 | 2/2006 | Hsu et al. |
| 7,155,083 B2 | 12/2006 | Baumann et al. |
| 8,611,705 B2 | 12/2013 | Kautzsch |

(Continued)

FOREIGN PATENT DOCUMENTS

| | | |
|---|---|---|
| CN | 1271435 C | 8/2006 |
| WO | 2014092454 A1 | 6/2014 |

*Primary Examiner* — Jerry Blevins
(74) *Attorney, Agent, or Firm* — Steven J. Meyers; Hoffman Warnick LLC (57) ABSTRACT

Various particular embodiments include a primary waveguide including an end section; cantilevered waveguides, each cantilevered waveguide including an end section disposed adjacent the end section of the primary waveguide; and control pins for applying an electrical bias to the cantilevered waveguides to selectively displace the end sections of the cantilevered waveguides away from the end section of the primary waveguide.

16 Claims, 10 Drawing Sheets

(56) References Cited

U.S. PATENT DOCUMENTS

| | | |
|---|---|---|
| 8,639,074 B2 | 1/2014 | Tang et al. |
| 2005/0180678 A1* | 8/2005 | Panepucci .............. G01D 5/266 385/13 |
| 2010/0183302 A1 | 7/2010 | Lamvik et al. |
| 2015/0253511 A1* | 9/2015 | Pelley .................. G02B 6/3584 385/14 |

* cited by examiner

FIG. 3 Splitter Configuration (No voltage Bias)

FIG. 4 Switch Configuration (Voltage Bias)

MEMS BASED PHOTONIC DEVICES AND METHODS FOR FORMING

TECHNICAL FIELD

The subject matter disclosed herein relates to integrated circuits. More particularly, the subject matter relates to micro-electro-mechanical systems (MEMS) based photonic devices and methods for forming.

BACKGROUND

Photonic devices in integrated circuits generally have a less than optimal yield. For instance, Geranium (Ge) photodetectors formed using current processing technologies generally have a low yield of about 70%. Other devices such as modulators may also have low yield depending on the fabrication process. To this extent, design redundancy is needed to address this issue. Unfortunately, the use of redundant photonic devices often leads to the loss of optical power.

Figure 1:
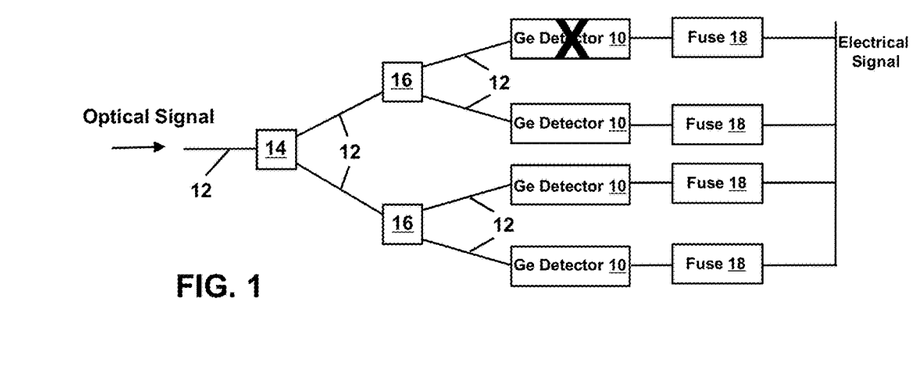
FIG. 1 depicts a redundant configuration of germanium (Ge) photodetectors.

FIG. 1 depicts a redundant configuration of Ge photodetectors 10. An optical signal travels via a silicon (Si) waveguide to a first splitter 14, which splits the optical signal between two paths. The divided optical signal is directed by Si waveguides 12 to another set of splitters 16, where the optical signal is further divided. Each of the four portions of the optical signal is provided to a respective Ge detector 10. Thus, one-quarter of the optical power of the optical signal is provided to each of the redundant Ge detectors 10. An e-fuse 18 controlled by CMOS logic is connected to each Ge detector 10 to provide redundancy. In this example, when one of the Ge detectors 10 is nonoperational (as indicated by the "X" in FIG. 1), its corresponding fuse 18 is activated to remove the defective Ge detector 10 from the optical circuit. However, one-quarter of the optical power of the optical signal is still provided to the defective Ge detector 10 and is lost.

SUMMARY

A first aspect includes a cantilevered semiconductor waveguide structure, including: a primary waveguide including an end section; cantilevered waveguides, each cantilevered waveguide including an end section disposed adjacent the end section of the primary waveguide; and control pins for applying an electrical bias to the cantilevered waveguides to selectively displace the end sections of the cantilevered waveguides away from the end section of the primary waveguide.

A second aspect includes a optical circuit, including: a plurality of cantilevered semiconductor waveguide structures, each cantilevered semiconductor waveguide structure comprising: a primary waveguide including an end section; cantilevered waveguides, each cantilevered waveguide including an end section disposed adjacent the end section of the primary waveguide; and control pins for applying an electrical bias to the cantilevered waveguides to selectively displace the end sections of the cantilevered waveguides away from the end section of the primary waveguide; and an optical path formed by selectively configuring at least one of the cantilevered waveguides to function as a photonic splitter, a photonic switch, or a photonic fuse.

A third aspect includes a method for controlling a path of light in an optical circuit, comprising: providing a cantilevered semiconductor waveguide structure in the optical circuit, the cantilevered semiconductor waveguide structure comprising: a primary waveguide including an end section; cantilevered waveguides, each cantilevered waveguide including an end section disposed adjacent the end section of the primary waveguide; and control pins for applying an electrical bias to the cantilevered waveguides to selectively displace the end sections of the cantilevered waveguides away from the end section of the primary waveguide; and configuring the cantilevered semiconductor waveguide structure as a photonic splitter for splitting an optical signal provided via the primary waveguide between the cantilevered waveguides, a photonic switch for selectively preventing the optical signal provided via the primary waveguide from passing into at least one of the cantilevered waveguides, or a photonic fuse for permanently preventing the optical signal provided via the primary waveguide from passing into at least one of the cantilevered waveguides.

BRIEF DESCRIPTION OF THE DRAWINGS

These and other features of this invention will be more readily understood from the following detailed description of the various aspects of the invention taken in conjunction with the accompanying drawings that depict various embodiments of the invention.

DETAILED DESCRIPTION

As noted, the subject matter disclosed herein relates to integrated circuits. More particularly, the subject matter relates to micro-electro-mechanical systems (MEMS) based photonic devices and methods for forming.

Figure 2:
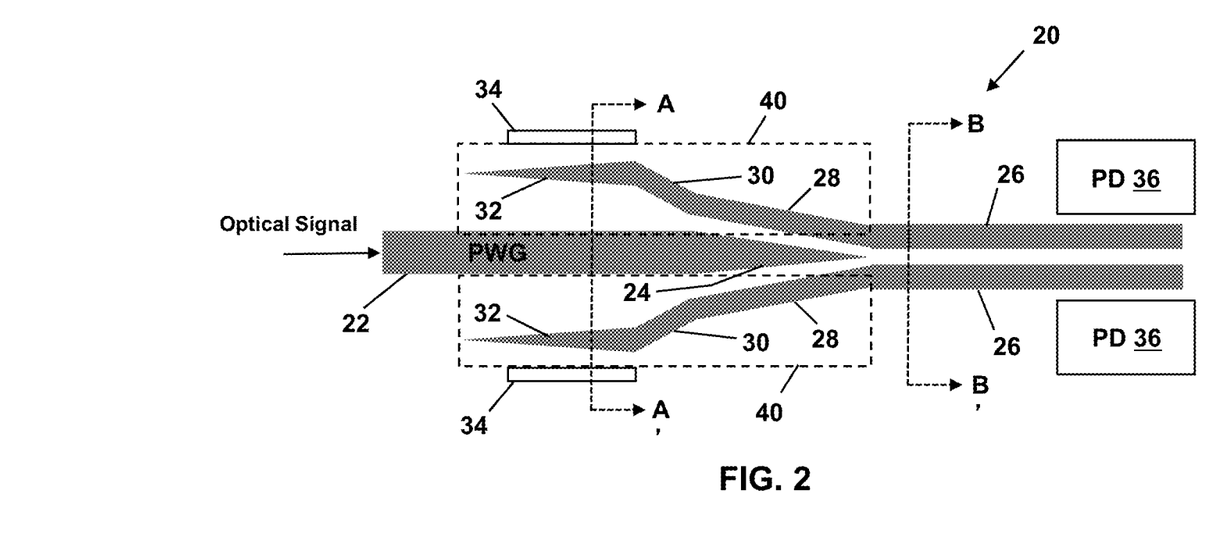
FIG. 2 depicts a cantilevered semiconductor waveguide structure, according to embodiments.

A cantilevered semiconductor waveguide structure 20 ("waveguide structure 20") according to embodiments is depicted in FIG. 2. As described in detail below, the waveguide structure 20 may be used to provide, for example, a photonic splitter, a photonic switch, and/or a photonic fuse.

The waveguide structure 20 includes a primary waveguide 22. The primary waveguide 22 may comprise, for example, a silicon (Si) waveguide. The primary waveguide 22 is provided with a tapered end section 24. The waveguide structure 20 further includes a pair of cantilevered waveguides 26. The cantilevered waveguides 26 may comprise, for example, Si waveguides.

A proximal end section 40 of each cantilevered waveguide 26 may include a first diverging section 28, a second diverging section 30, and a tapered end section 32. A control pin 34 is provided adjacent each tapered end section 30 of the cantilevered waveguides 26. A photodetector 36 (e.g., a germanium (Ge) photodetector) may be coupled to each of the cantilevered waveguides 26. Sections 28, 30 and 32 are cantilever structures while section 26 (outside region 40) may not be a cantilever as shown later in FIGS. 8 and 9.

According to embodiments, the waveguide structure 20 may be used to provide, for example, a photonic splitter, a photonic switch, and/or a photonic fuse, which can be used to introduce redundancies into photonic circuits. Which functionality is provided by the waveguide structure 20 is controlled by selectively applying an electrical bias between the cantilevered waveguides 26 and the control pins 34.

Figure 3:
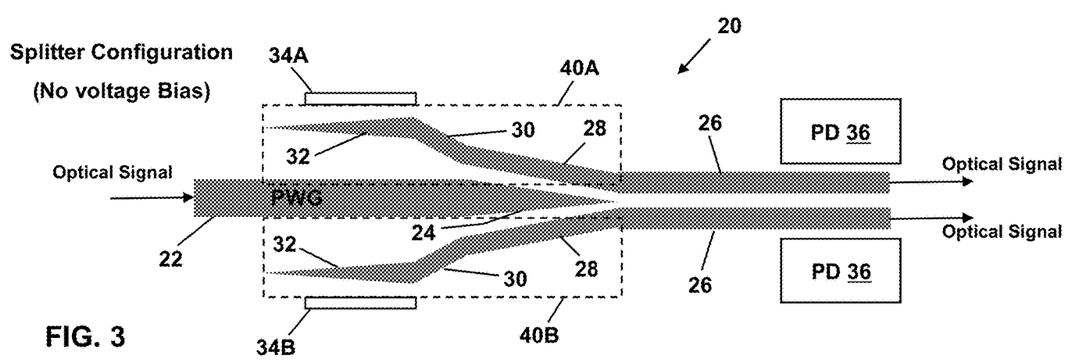
FIG. 3 depicts the cantilevered semiconductor waveguide structure of FIG. 2 configured as a photonic splitter, according to embodiments.

As depicted in FIG. 3, a photonic splitter may be provided when no electrical bias is applied between the control pins 34 and the proximal end section 40 of the cantilevered waveguides 26. In this case, the distance between the tapered end section 24 of the primary waveguide 22 and the first diverging section 28 of each cantilevered waveguide 26 is small enough (e.g., <about 0.2 μm for Si waveguides) to provide optical coupling therebetween. To this extent, as depicted in FIG. 3, a photonic splitter is provided for splitting an optical signal provided via the primary waveguide 22 between the two cantilevered waveguides 26.

Figure 4:
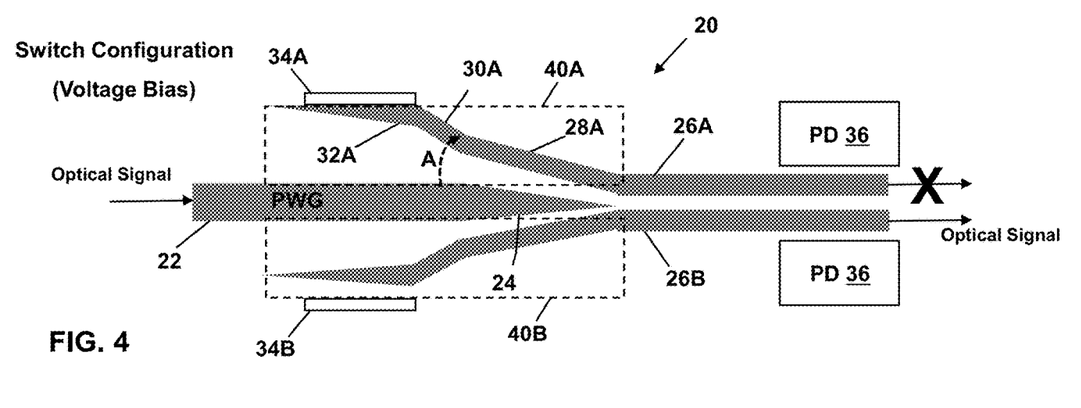
FIGS. 4-6 depict the cantilevered semiconductor waveguide structure of FIG. 2 configured as a photonic switch, according to embodiments.

A photonic switch may be provided by selectively applying an electrical bias between the control pins 34 and the proximal end section 40 of one or both of the cantilevered waveguides 26. For example, as depicted in FIG. 4, an electrical bias is applied between the control pin 34A and the proximal end section 40A of the cantilevered waveguide 26A, while no electrical bias is applied between the control pin 34B and the proximal end section 40B of the cantilevered waveguide 26B. The electrical bias applied between the control pin 34A and the proximal end section 40A of the cantilevered waveguide 26A causes the proximal end section 40A of the cantilevered waveguide 26A to move laterally away from the primary waveguide 22 as indicated by arrow A. The cantilevered waveguide 26B is not displaced because no electrical bias is applied between the control pin 34B and the proximal end section 40B of the cantilevered waveguide 26B. In this case, the distance between the tapered end section 24 of the primary waveguide 22 and the first diverging section 28A of the cantilevered waveguide 26A is too large to provide optical coupling therebetween. To this extent, as depicted in FIG. 4, a photonic switch is provided to selectively "turn off" optical coupling between the primary waveguide 22 and the cantilevered waveguide 26A. When the electrical bias applied between the control pin 34A and the proximal end section 40A of the cantilevered waveguide 26A is removed, the proximal end section 40A of the cantilevered waveguide 26A moves back to its original position (e.g., as shown in FIG. 3), thereby restoring optical coupling between the primary waveguide 22 and the cantilevered waveguide 26A.

Figure 5:
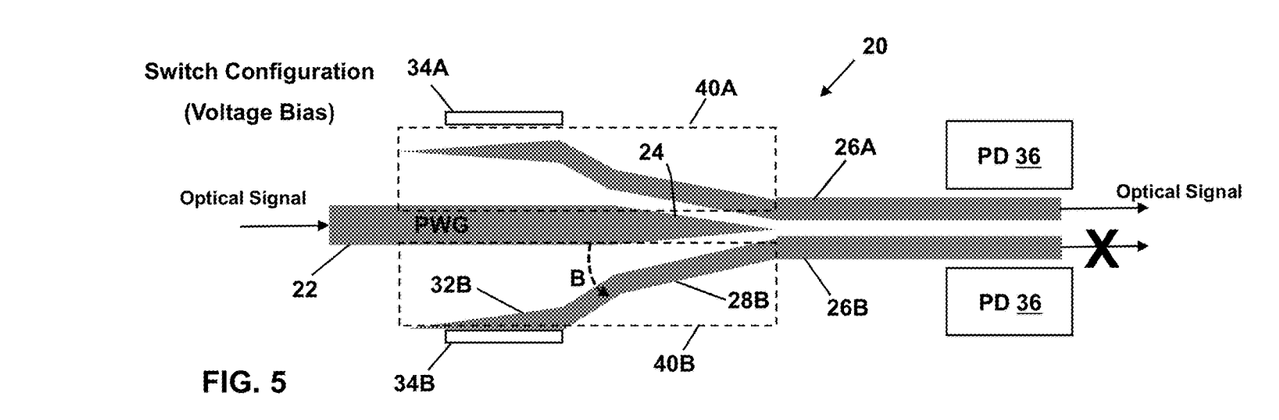

In another case, for example, as depicted in FIG. 5, an electrical bias is applied between the control pin 34B and the proximal end section 40B of the cantilevered waveguide 26B, while no electrical bias is applied between the control pin 34A and the proximal end section 40A of the cantilevered waveguide 26A. The electrical bias applied between the control pin 34B and the proximal end section 40B of the cantilevered waveguide 26B causes the proximal end section 40B of the cantilevered waveguide 26B to move laterally away from the primary waveguide 22 as indicated by arrow B. The proximal end section 40A of the cantilevered waveguide 26A is not displaced because no electrical bias is applied between the control pin 34A and the proximal end section 40A of the cantilevered waveguide 26A. In this case, the distance between the tapered end section 24 of the primary waveguide 22 and the first diverging section 28B of the cantilevered waveguide 26B is too large to provide optical coupling therebetween. To this extent, as depicted in FIG. 5, a photonic switch is provided to selectively "turn off" optical coupling between the primary waveguide 22 and the cantilevered waveguide 26B. When the electrical bias applied between the control pin 34B and the proximal end section 40B of the cantilevered waveguide 26B is removed, the proximal end section 40B of the cantilevered waveguide 26B moves back to its original position (e.g., as shown in FIG. 3), thereby restoring optical coupling between the primary waveguide 22 and the cantilevered waveguide 26B.

Figure 6:
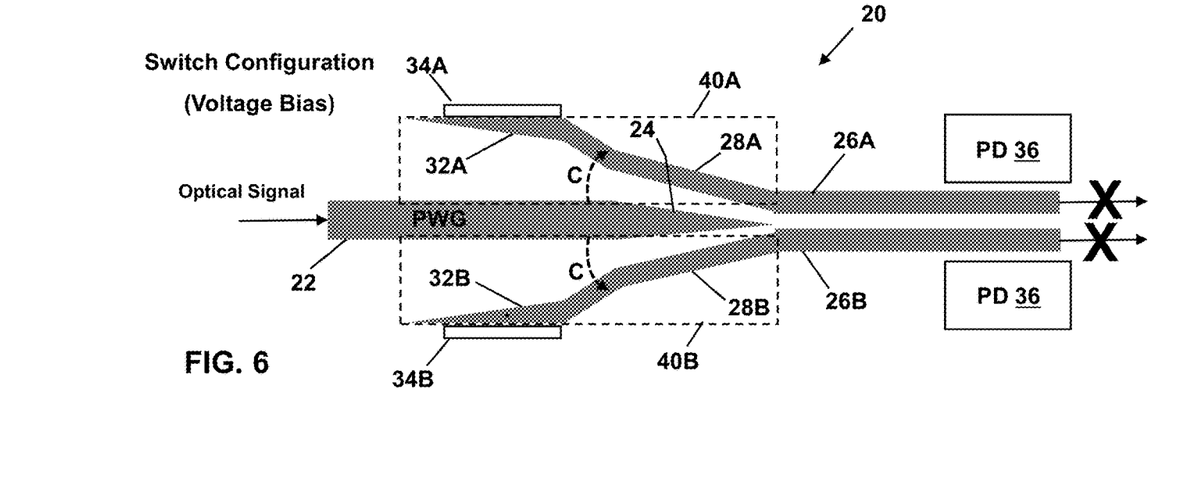

In yet another case, for example, as depicted in FIG. 6, a separate electrical bias is applied between the control pin 34A and the proximal end section 40A of the cantilevered waveguide 26A and between the control pin 34B and the proximal end section 40B of the cantilevered waveguide 26B. The applied electrical biases cause the proximal end sections 40A, 40B of both the cantilevered waveguide 26A and the cantilevered waveguide 26B to move laterally away in opposite directions from the primary waveguide 22 as indicated by arrows C. In this case, the distance between the tapered end section 24 of the primary waveguide 22 and the first diverging section 28A of the cantilevered waveguide 26A, as well as the distance between the tapered end section 24 of the primary waveguide 22 and the first diverging section 28B of the cantilevered waveguide 26B, are both too large to provide optical coupling therebetween. To this extent, as depicted in FIG. 6, a photonic switch is provided to selectively "turn off" optical coupling between the primary waveguide 22 and both of the cantilevered waveguides 26A, 26B. Upon removal of the electrical biases, the proximal end sections 40A, 40B of the cantilevered waveguides 26A, 26B move back to their original position (e.g., as shown in FIG. 3), restoring optical coupling between the primary waveguide 22 and the cantilevered waveguides 26A, 26B.

Figure 7:
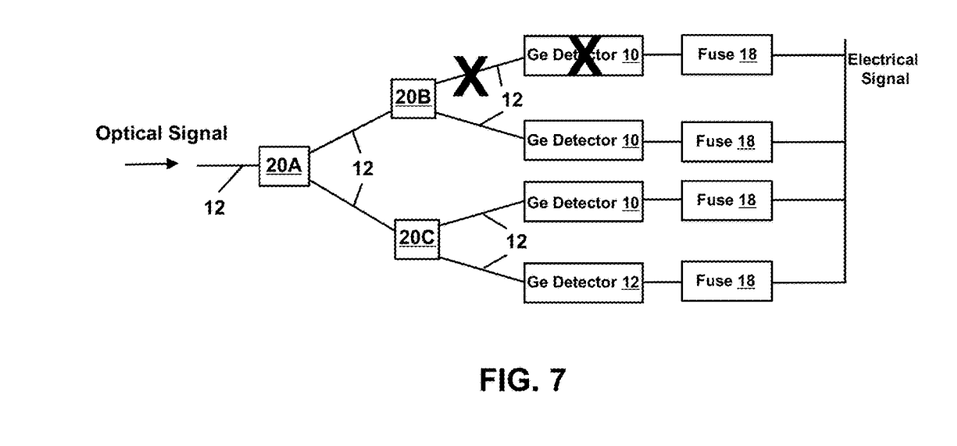
FIG. 7 depicts a redundant configuration of germanium (Ge) photodetectors, according to embodiments.

According to embodiments, the waveguide structure 20 may be selectively configured for used as a photonic splitter and/or photonic switch to control the path of light through an optical circuit. For instance, FIG. 7 depicts a configuration similar to that described with regard to FIG. 1, but including a plurality of waveguide structures 20A-20C. In this example, the waveguide structures 20A and 20C are configured (see, e.g., FIG. 3) as photonic splitters. The waveguide 20B, however, is configured (see, e.g., FIG. FIG. 4) as a photonic switch to decouple the defective Ge detector 10 from the optical circuit. To this extent, no optical power is lost due to the defective Ge detector 10. That is, all of the optical power is provided to the three operational Ge detectors 10. As depicted in FIG. 7, therefore, a plurality of waveguide structures 20 may be selectively interconnected together to form an optical path through an optical circuit. The optical path can be provided, for example, by selectively controlling the functionality of the plurality of interconnected waveguide structures 20 (e.g., photonic splitter, photonic switch, or photonic fuse (see below)).

Figure 8:
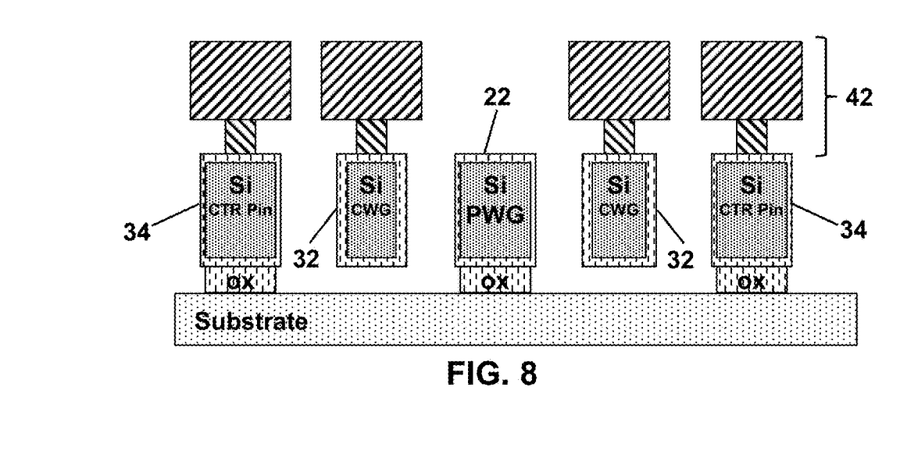
FIG. 8 is a cross-sectional view of the waveguide structure taken along line A-A' in FIG. 2, according to embodiments.
Figure 9:
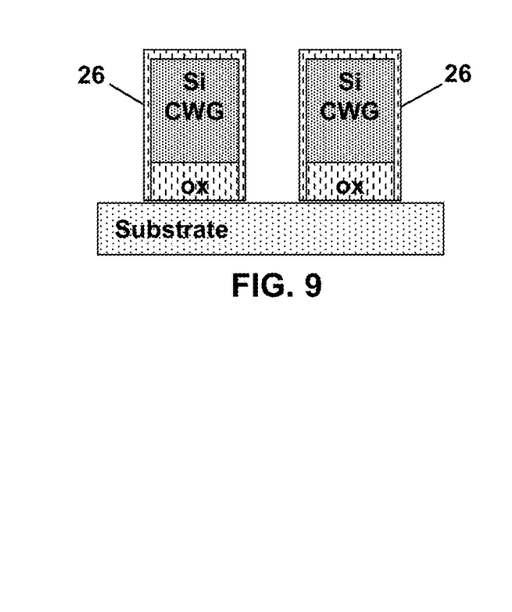
FIG. 9 is a cross-sectional view of the waveguide structure taken along line B-B' in FIG. 2, according to embodiments.

FIG. 8 is a cross-sectional view of the waveguide structure 20 taken along line A-A' in FIG. 2, according to embodiments. FIG. 9 is a cross-sectional view of the waveguide structure 20 taken along line B-B' in FIG. 2, according to embodiments. Contact structures 42 are provided on the control pins 34 and on the proximal end sections 40 of the cantilevered waveguides 26.

Figure 10:
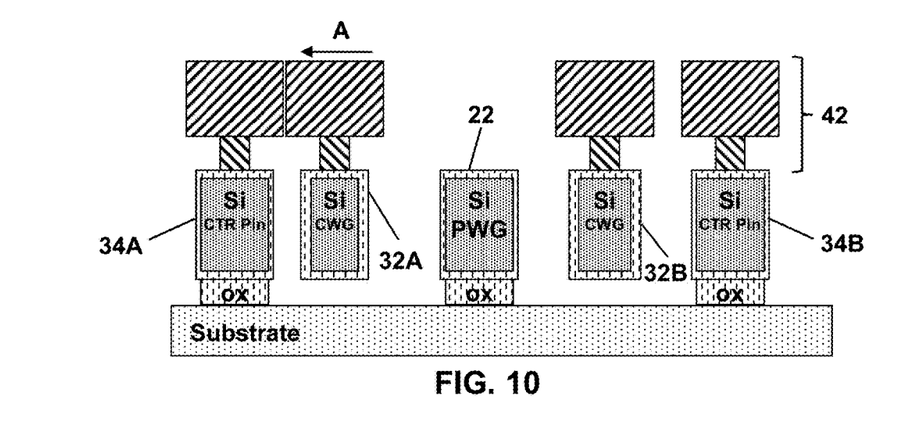
FIGS. 10 and 11 are cross-sectional views of the waveguide structure of FIG. 2 under different electrical biases.
Figure 11:
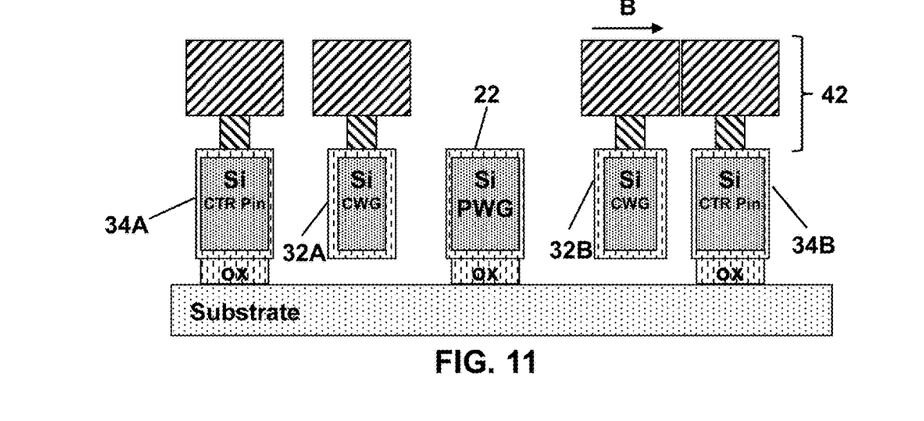

As described above, electrical bias(es) may be selectively applied between the control pins 34 and the proximal end sections 40 of the cantilevered waveguides 26 to configure the operation of the waveguide structure 20. In FIG. 10, for example, an electrical bias is applied between the control pin 34A and the proximal end section 40A of the cantilevered waveguide 26A (e.g., via their corresponding contact structures 42), while no electrical bias is applied between the control pin 34B and the proximal end section 40B of the cantilevered waveguide 26B. This causes the proximal end section 40A (including the tapered end section 32A) of the cantilevered waveguide 26A to move laterally away from the primary waveguide 22 as indicated by arrow A (see also FIG. 4). In a similar manner, in FIG. 11, an electrical bias is applied between the control pin 34B and the proximal end section 40B of the cantilevered waveguide 26B (e.g., via their corresponding contact structures 42), while no electrical bias is applied between the control pin 34A and the proximal end section 40A of the cantilevered waveguide 26A. This causes the proximal end section 40B (including the tapered end section 32B) of the cantilevered waveguide 26B to move laterally away from the primary waveguide 22 as indicated by arrow B (see also FIG. 5).

An illustrative process for forming the structure shown in FIG. 8 is provided in FIGS. 12-15. Known semiconductor processing techniques may used to form the structure. A similar process may be used to form the structure depicted in FIG. 9.

Figure 12:
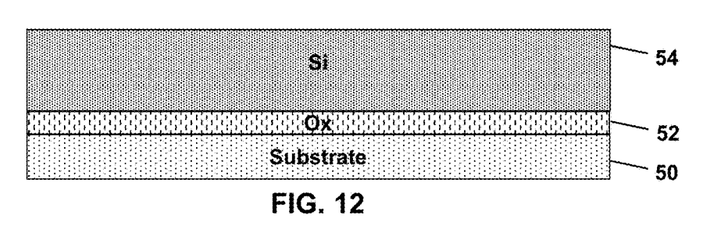
FIGS. 12-15 depict an illustrative process for forming the structure shown in FIG. 8, according to embodiments.
Figure 13:
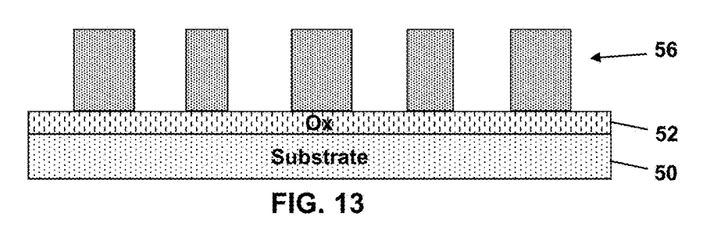
Figure 14:
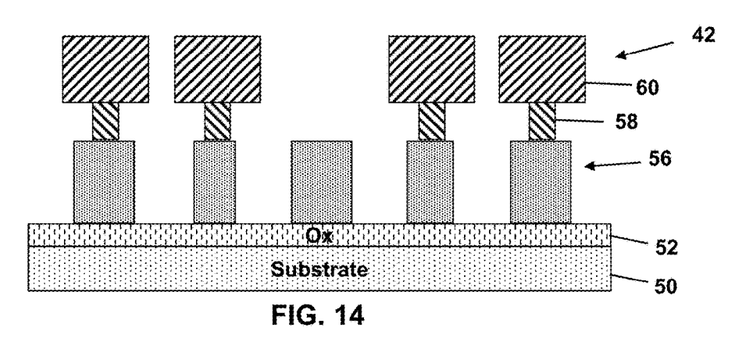
Figure 15:
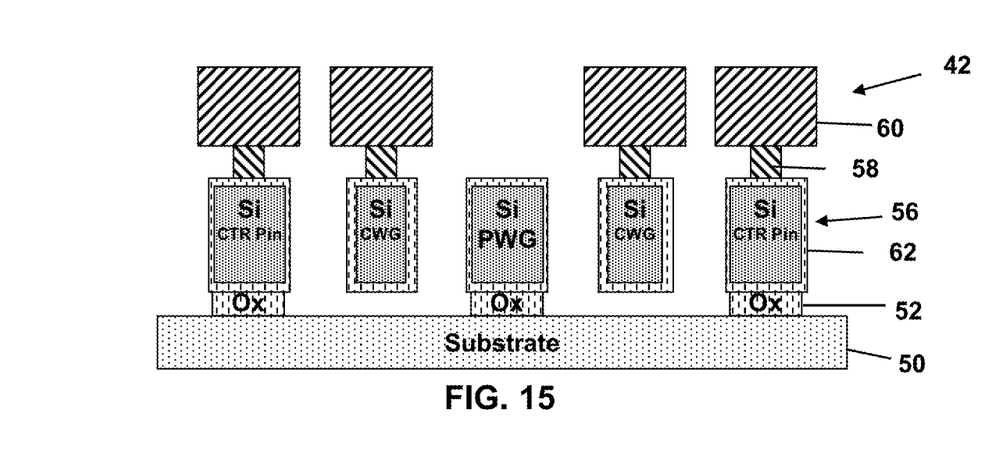

In FIG. 12, an SOI semiconductor wafer including a substrate 50, oxide layer 52, and silicon (Si) layer 54 is provided. In FIG. 13, a plurality of silicon structures 56 are formed in the Si layer 54. In FIG. 14, a metal contact structure 42 is formed over each semiconductor structure 56. Each contact structure 42 may include, for example, a metal plug 58 formed of a metal such as tungsten (W) and a metal contact 60 formed of a metal such as aluminum (Al). In FIG. 15, the silicon structures 56 corresponding to the cantilevered waveguides are freed from the substrate 50, and a layer oxide 62 is deposited onto each of the silicon structures 56 for passivation. The tapered end section 32 of the proximal end section 40 of the cantilevered waveguides 26 as well as the tapered end section 24 of the primary waveguide 22 may be formed using suitable semiconductor processing and masking techniques.

Figures 16, 17:
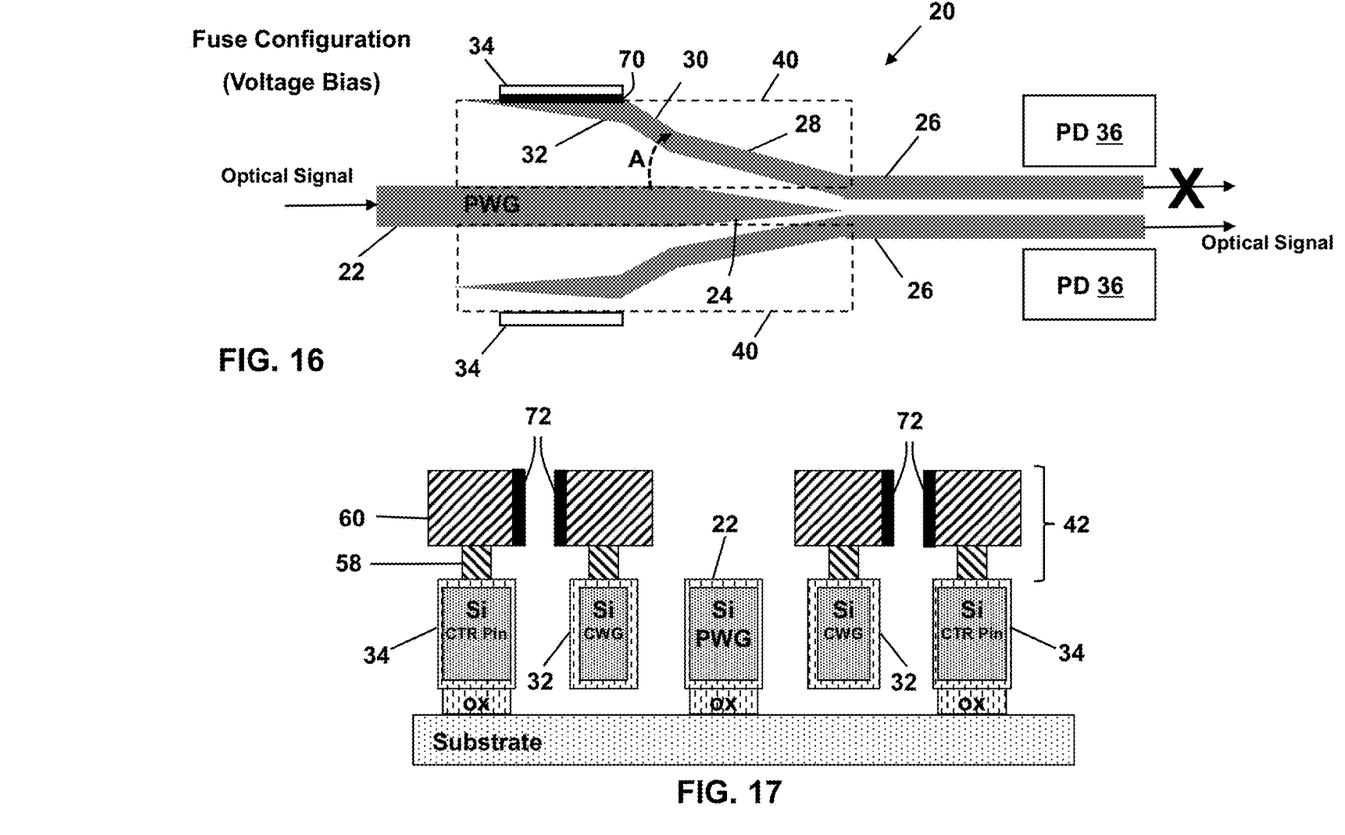
FIG. 16 depicts the cantilevered semiconductor waveguide structure of FIG. 2 configured as a fuse, according to embodiments.
FIG. 17 depicts the structure of FIG. 8, further including a fusable material provided on facing surfaces of the metal contacts of the cantilevered waveguides and the control pins, according to embodiments.
Figure 18:
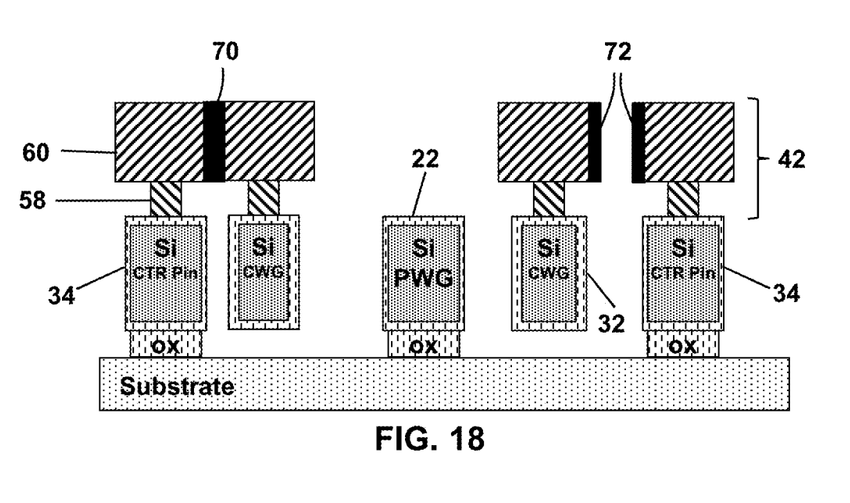
FIG. 18 depicts the structure of FIG. 17, where a permanent connection is formed between metal contacts, according to embodiments.

According to embodiments, as depicted in FIG. 16, the cantilevered semiconductor waveguide structure 20 of FIG. 2 may be configured as a photonic fuse, wherein a permanent connection 70 is formed between a proximal end section 40 of a cantilevered waveguide 26 and a control pin 34. Such a permanent connection 70 may be formed in a number of ways. For example, as shown in FIG. 17, a fusable material 72 may be provided on facing surfaces of the metal contacts 60 of the cantilevered waveguides 26 and the control pins 34. The fusable material 72 may comprise, for example, metals with low melting temperatures such as aluminum (Al), tin (Sn), selenium (Se), zinc (Zn), magnesium (Mg), etc., silicides, or any other suitable material. A charge pump may be used to provide a high current through the end section 40 of the cantilevered waveguide 26 and the control pin 34. As depicted in FIG. 18, the high current fuses together (e.g., via electromigration) the fusable material 72 on the end section 40 of the cantilevered waveguide 26 and the fusable material 72 on the control pin 34 to form the permanent connection 70. Higher temperatures may be applied during the fusing process to accelerate electromigration.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A cantilevered semiconductor waveguide structure, comprising:
   a primary waveguide including an end section;
   cantilevered waveguides, each cantilevered waveguide including an end section disposed adjacent the end section of the primary waveguide; and
   control pins for applying an electrical bias to the cantilevered waveguides to selectively displace the end sections of the cantilevered waveguides away from the end section of the primary waveguide,
   wherein the cantilevered semiconductor waveguide structure comprises a photonic splitter for splitting an optical signal provided via the primary waveguide between the cantilevered waveguides.

2. The cantilevered semiconductor waveguide structure according to claim 1, wherein a function of the cantilevered semiconductor waveguide structure is selectively changeable from the photonic splitter to a photonic switch or a photonic fuse based on the electrical bias applied to the cantilevered waveguides.

3. The cantilevered semiconductor waveguide structure according to claim 1, wherein the electrical bias is not applied to the end sections of any of the cantilevered waveguides, and wherein none of the end sections of the cantilevered waveguides are displaced away from the end section of the primary waveguide.

4. The cantilevered semiconductor waveguide structure according to claim 2, wherein the function of the cantilevered semiconductor waveguide structure is selectively changed from the photonic splitter to the photonic switch by applying the electrical bias to the end section of at least one of the cantilevered waveguides to displace the end section of the at least one of the cantilevered waveguides away from the end section of the primary waveguide.

5. The cantilevered semiconductor waveguide structure according to claim 4, wherein the displaced end section of the at least one of the cantilevered waveguides returns to an original position upon removal of the applied electrical bias.

6. The cantilevered semiconductor waveguide structure according to claim 1, wherein the end sections of the cantilevered waveguides and the control pins comprise a fusable material for forming a permanent connection therebetween.

7. An optical circuit, comprising:
   a plurality of cantilevered semiconductor waveguide structures, each cantilevered semiconductor waveguide structure comprising:
      a primary waveguide including an end section;
      cantilevered waveguides, each cantilevered waveguide including an end section disposed adjacent the end section of the primary waveguide; and
      control pins for applying an electrical bias to the cantilevered waveguides to selectively displace the end sections of the cantilevered waveguides away from the end section of the primary waveguide;
   wherein at least one of the cantilevered semiconductor waveguide structures is configured as a photonic splitter by not applying the electrical bias to the end sections of any of the cantilevered waveguides, wherein none of the end sections of the cantilevered waveguides are displaced away from the end section of the primary waveguide.

8. The optical circuit according to claim 7, wherein at least one of the cantilevered semiconductor waveguide structures is configured as a photonic switch by:
   applying the electrical bias to the end section of at least one of the cantilevered waveguides to displace the end section of the at least one of the cantilevered waveguides away from the end section of the primary waveguide.

9. The optical circuit according to claim 8, wherein the displaced end section of the at least one of the cantilevered waveguides returns to an original position upon removal of the applied electrical bias.

10. The optical circuit according to claim 7, wherein at least one of the cantilevered semiconductor waveguide structures is configured as a photonic fuse by:
    applying the electrical bias to the end section of at least one of the cantilevered waveguides to permanently displace the end section of the at least one of the cantilevered waveguides away from the end section of the primary waveguide.

11. The optical circuit according to claim 10, wherein the end sections of the cantilevered waveguides and the control pins of the at least one of the cantilevered semiconductor waveguide structures comprise a fusable material for forming a permanent connection therebetween.

12. A method for controlling a path of light in an optical circuit, comprising:
    providing a cantilevered semiconductor waveguide structure in the optical circuit, the cantilevered semiconductor waveguide structure comprising:
       a primary waveguide including an end section;
       cantilevered waveguides, each cantilevered waveguide including an end section disposed adjacent the end section of the primary waveguide; and
       control pins for applying an electrical bias to the cantilevered waveguides to selectively displace the end sections of the cantilevered waveguides away from the end section of the primary waveguide; and
    configuring the cantilevered semiconductor waveguide structure as a photonic splitter for splitting an optical signal provided via the primary waveguide between the cantilevered waveguides.

13. The method according to claim 12, wherein configuring the cantilevered semiconductor waveguide structure as the photonic splitter further includes not applying the electrical bias to the end sections of any of the cantilevered waveguides, wherein none of the end sections of the cantilevered waveguides are displaced away from the end section of the primary waveguide.

14. The method according to claim 12, wherein a function of the cantilevered semiconductor waveguide structure is selectively changeable from the photonic splitter to a photonic switch by applying the electrical bias is applied to the end section of at least one of the cantilevered waveguides to displace the end section of the at least one of the cantilevered waveguides away from the end section of the primary waveguide.

15. The method according to claim 14, wherein the displaced end section of the at least one of the cantilevered waveguides returns to an original position upon removal of the applied electrical bias.

16. The method according to claim 12, wherein a function of the cantilevered semiconductor waveguide structure is selectively changeable from the photonic splitter to a photonic fuse by applying the electrical bias to the end section of at least one of the cantilevered waveguides to permanently displace the end section of the at least one of the cantilevered waveguides away from the end section of the primary waveguide.

* * * * *